US012614571B2

(12) United States Patent
Gonapati et al.

(10) Patent No.: US 12,614,571 B2
(45) Date of Patent: Apr. 28, 2026

(54) APPARATUSES AND METHODS FOR ADJUSTING SENSE AMPLIFIER VOLTAGE THRESHOLD COMPENSATION BASED ON TEMPERATURE

(71) Applicant: MICRON TECHNOLOGY, INC., Boise, ID (US)

(72) Inventors: Kishan Reddy Gonapati, Hyderabad (IN); Dong Pan, Boise, ID (US); Ming Hai Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 208 days.

(21) Appl. No.: 18/633,346

(22) Filed: Apr. 11, 2024

(65) Prior Publication Data
US 2024/0355366 A1 Oct. 24, 2024

Related U.S. Application Data

(60) Provisional application No. 63/461,165, filed on Apr. 21, 2023.

(51) Int. Cl.
*G11C 7/04* (2006.01)
*G11C 7/08* (2006.01)
*G11C 7/22* (2006.01)

(52) U.S. Cl.
CPC .................. *G11C 7/04* (2013.01); *G11C 7/08* (2013.01); *G11C 7/222* (2013.01)

(58) Field of Classification Search
CPC .. G11C 7/04; G11C 7/08; G11C 7/222; G11C 7/065; G11C 11/4076; G11C 11/4091; G11C 2207/2254; G11C 16/349; G11C 29/50004
USPC .......................................................... 365/211
See application file for complete search history.

(56) References Cited

U.S. PATENT DOCUMENTS 11,699,479 B2 * 7/2023 Park .................. G11C 13/0026
365/185.21
2009/0080267 A1 * 3/2009 Bedeschi ............... G11C 5/147
327/543

* cited by examiner

*Primary Examiner* — Huan Hoang
(74) *Attorney, Agent, or Firm* — Dorsey & Whitney LLP

(57) ABSTRACT
A semiconductor device may include a voltage threshold compensation (VTC) sense amplifier configured to amplify signals read from memory cells to recognizable logic levels. The VTC sense amplifier may equalize threshold voltages of transistors at the sense amplifier during a compensation phase before sensing a memory cell. The compensation phase may be delayed or extended in duration by an amount based on a combination of currents that are proportional to absolute temperature (PTAT) and zero to absolute temperature (ZTAT), or PTAT and complementary to absolute temperature (CTAT). Different combinations of PTAT and ZTAT currents, or PTAT and CTAT currents, may correspond to different temperature slopes. The semiconductor device may choose from the different temperature slopes to achieve different delays for given temperatures.

20 Claims, 6 Drawing Sheets

APPARATUSES AND METHODS FOR ADJUSTING SENSE AMPLIFIER VOLTAGE THRESHOLD COMPENSATION BASED ON TEMPERATURE

CROSS-REFERENCE TO RELATED APPLICATIONS

This application claims the filing benefit of U.S. Provisional Application No. 63/461,165, filed Apr. 21, 2023. This application is incorporated by reference herein in its entirety and for all purposes.

BACKGROUND

A memory device may read data from memory cells in a memory array as signals on bit lines. However, the signals may be low-power signals. Using a sense amplifier, the memory device may amplify the low-power signals to recognizable logic levels by the memory device (e.g., corresponding to a "0" or a "1"). In some cases, the sense amplifier may include a voltage threshold compensation (VTC) sense amplifier. The VTC sense amplifier may perform operations during one or more phases, such as a compensation phase, prior to sensing. During the compensation phase, the VTC sense amplifier may equalize threshold voltages at corresponding transistors of the VTC sense amplifier.

DETAILED DESCRIPTION

Figure 1:
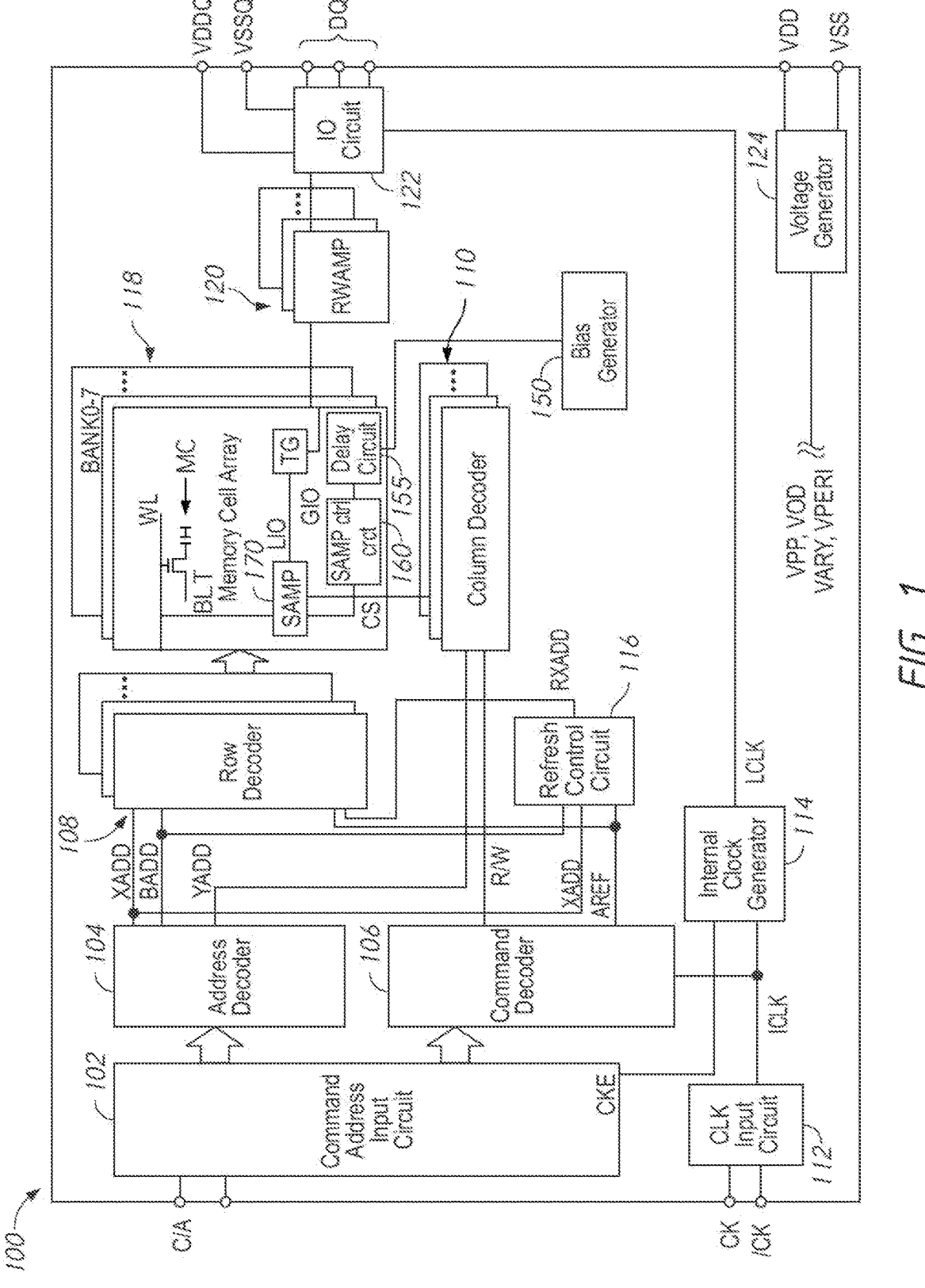
FIG. 1 is a block diagram of a semiconductor device according to an embodiment of the disclosure.

Various embodiments of the present disclosure will be explained below in detail with reference to the accompanying drawings. The following detailed description refers to the accompanying drawings that show, by way of illustration, specific aspects in which embodiments of the present disclosure may be practiced. These embodiments are described in sufficient detail to enable those skilled in the art to practice the embodiments of present disclosure. Other embodiments may be utilized, and structure, logical and electrical changes may be made without departing from the scope of the present disclosure. The various embodiments disclosed herein are not necessary mutually exclusive, as some disclosed embodiments can be combined with one or more other disclosed embodiments to form new embodiments.

Certain details are set forth below to provide a sufficient understanding of embodiments of the disclosure. However, it will be clear to one skilled in the art that embodiments of the disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring embodiments of the disclosure. Additionally, terms such as "couples" and "coupled" mean that two components may be directly or indirectly electrically coupled. Indirectly coupled may imply that two components are coupled through one or more intermediate components.

In some memory devices, a voltage threshold compensation (VTC) sense amplifier may equalize threshold voltages (e.g., Vth) at corresponding transistors of the VTC sense amplifier during a compensation phase, prior to sensing data from memory cells for sense amplification. Equalizing threshold voltages at corresponding transistors may result in the VTC sense amplifier being able to improve a sense margin of the sense amplifier. The sense margin may be the amount of voltage that can be accurately detected by the VTC sense amplifier. In some cases, a memory device may extend the duration of the compensation phase by a delay, which may vary with temperature. For example, the memory device may be able to delay the compensation phase by a first amount at a given temperature, and by a different amount at a different temperature. Accordingly, a line on a plot of delay versus temperature may be referred to as a "temperature slope." However, it may be desirable for the memory device to be able to use different temperature slopes for different scenarios. For example, the memory device may be able to achieve improved sense margins by using a different (e.g., steeper or shallower) temperature slope. For example, to achieve a higher delay at a higher temperature while maintaining a lower delay at a lower temperature, a temperature slope with a steeper slope may be desirable. As such, a memory device capable of supporting multiple temperature slopes may be desirable.

To achieve different temperature slopes, the memory device may include a delay bias generator circuit that is configured to generate a delay bias based on a control signal that indicates which temperature slope is desired. The delay bias may be provided to a bias controlled delay circuit that adjusts delay based on the delay bias. The voltage of the delay bias may indicate or be used by the memory device to generate a delay for the compensation phase. The delay bias generator circuit may be able to support different temperature slopes based on combinations of temperature dependent and/or independent currents, for example, combinations of a proportional to absolute temperature (PTAT) current and a zero to absolute temperature current (ZTAT), or a PTAT current and a complementary to absolute temperature current (CTAT). In some embodiments, the memory device may change the proportion of PTAT to ZTAT current for a given temperature based on the control signal. In some embodiments, the memory device may change the proportion of PTAT to CTAT current for a given temperature based on the control signal. These different proportions of PTAT to ZTAT current, or PTAT to CTAT current, for a same given temperature correspond to the different temperature slopes. As temperature increases, a steeper temperature slope may result in greater delays for the compensation phase for a given temperature than more gradual temperature slopes. Longer delays for the compensation phase may improve sense margin by the sense amplifier, or may give adequate time for processes that occur during the compensation phase that may take longer due to a higher temperature, among other benefits.

FIG. 1 is a block diagram of a semiconductor device 100 according to an embodiment of the disclosure. The semiconductor device 100 may include a CLK input circuit 112, an internal clock generator 114, an address/command input circuit 102, an address decoder 104, a command decoder 106, a plurality of row (e.g., first access line) decoders 108, a memory cell array 118 including sense amplifiers SAMP and transfer gates TG, a plurality of column (e.g., second access line) decoders 110, read/write amplifiers 120, an input/output (I/O) circuit 120, a voltage generator circuit 124, a bias generator 150, a delay circuit 155, a sense amplifier control circuit 160, and a sense amplifier (SAMP) 170. The semiconductor device 100 may include a plurality of external terminals including address and command terminals C/A coupled to command/address bus, clock terminals CK and/CK, data terminals DQ, DQS, and DM, and power supply terminals VDD and VSS.

The memory cell array 118 includes a plurality of banks BANK0-7. In some examples, the memory cell array 118 may include more or fewer than 8 banks without departing from the scope of the disclosure. Each bank BANK0-7 may include a plurality of word lines WL, a plurality of bit lines BL, and a plurality of memory cells MC arranged at intersections of the plurality of word lines WL and the plurality of bit lines BL. The selection of the word line WL for each bank BANK0-N is performed by a corresponding row decoder 108 and the selection of the bit line BL is performed by a corresponding column decoder 110. The plurality of sense amplifiers SAMP are located for their corresponding bit lines BL and coupled to at least one respective local I/O line (LIO) further coupled to a respective one of at least two main I/O line pairs, via transfer gates TG, which function as switches. The sense amplifiers SAMP and transfer gates TG may be operated based on control signals from decoder circuitry, which may include the command decoder 106, the row decoders 108, the column decoders 110, any control circuitry of the memory cell array 118 of the banks BANK0-7, or any combination thereof.

The command/address input circuit 102 may receive an address signal and a bank address signal from outside at the command/address terminals C/A via a command/address bus and transmit the address signal and the bank address signal to the address decoder 104. The address decoder 104 may decode the address signal received from the command/address input circuit 102 and provide a row address signal XADD to the row decoder 108, and a column address signal YADD to the column decoder 110. The address decoder 104 may also receive the bank address signal and provide the bank address signal BADD to the row decoder 108 and the column decoder 110.

The command/address input circuit 102 may receive a command signal from outside, such as, for example, a memory controller at the command/address terminals C/A via the command/address bus and provide the command signal to the command decoder 106. The command decoder 106 may decode the command signal and generate various internal command signals. For example, the internal command signals may include a row command signal to select a word line, or a column command signal, such as a read command or a write command, to select a bit line.

Accordingly, when a read command is issued and a row address and a column address are timely supplied with the read command, read data is read from a memory cell in the memory cell array 118 designated by the row address and the column address. The read/write amplifiers 120 may receive the read data DQ and provide the read data DQ to the IO circuit 122. The IO circuit 122 may provide the read data DQ to outside via the data terminals DQ. Similarly, when the write command is issued and a row address and a column address are timely supplied with the write command, and then the IO circuit 122 may receive write data at the data terminals DQ and provide the write data via the read/write amplifiers 120 to the memory cell array 118. Thus, the write data may be written in the memory cell designated by the row address and the column address.

Turning to the explanation of the external terminals included in the semiconductor device 100, the clock terminals CK and/CK may receive an external clock signal and a complementary external clock signal, respectively. The external clock signals (including complementary external clock signal) may be supplied to a clock input circuit 112. The clock input circuit 112 may receive the external clock signals and generate an internal clock signal ICLK. The clock input circuit 112 may provide the internal clock signal ICLK to an internal clock generator 114. The internal clock generator 114 may generate a phase controlled internal clock signal LCLK based on the received internal clock signal ICLK and a clock enable signal CKE from the command/address input circuit 102. Although not limited thereto, a DLL circuit may be used as the internal clock generator 114. The internal clock generator 114 may provide the phase controlled internal clock signal LCLK to the IO circuit 122. The IO circuit 122 may use the phase controller internal clock signal LCLK as a timing signal for determining an output timing of read data.

The power supply terminals may receive power supply voltages VDD and VSS. These power supply voltages VDD and VSS may be supplied to a voltage generator circuit 124. The voltage generator circuit 124 may generate various internal voltages, VPP, VOD, VARY, VPERI, and the like based on the power supply voltages VDD and VSS. The internal voltage VPP is mainly used in the row decoder 108, the internal voltages VOD and VARY are mainly used in the sense amplifiers SAMP included in the memory cell array 118, and the internal voltage VPERI is used in many other circuit blocks. The IO circuit 122 may receive the power supply voltages VDD and VSSQ. For example, the power supply voltages VDDQ and VSSQ may be the same voltages as the power supply voltages VDD and VSS, respectively. However, the dedicated power supply voltages VDDQ and VSSQ may be used for the IO circuit 122.

In some examples, the semiconductor device 100 may include a bias generator 150. Bias generator 150 may provide a VTC delay bias to one or more delay circuits 155. For example, each bank of banks 0-7 may include a delay circuit 155. Delay circuit 155 may delay a compensation control signal based on the VTC delay bias and provide the delayed signal to a sense amplifier control circuit 160. Each bank of the banks 0-7 may include a sense amplifier control circuit 160. Sense amplifier control circuit 160 may provide a supply line control signal to SAMP 170 based on the delayed signal, such as a pulse signal. SAMP 170 may include a VTC sense amplifier. Each bank of the banks 0-7 may include one or more SAMPs 170. SAMP 170 may be configured to receive signals via bit lines (e.g., BLT) indicative of stored data states from the memory cell MC of the memory cell array and amplify the received signals. A compensation phase of a VTC operation of the SAMP 170 may be delayed (e.g., the duration of the VTC operation extended by the delay) using the supply line control signal.

Figure 2:
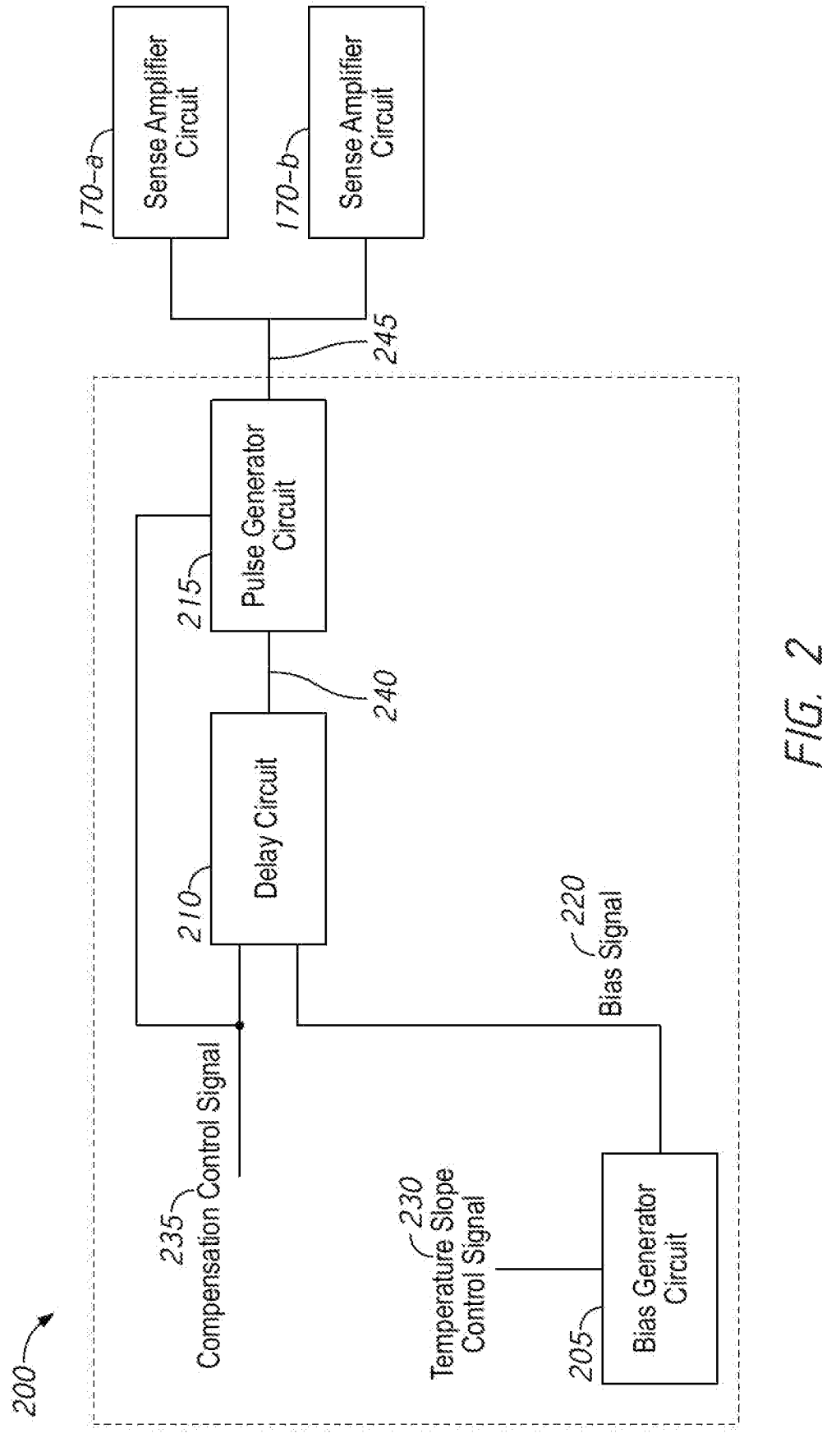
FIG. 2 is a block diagram of a signal delay path according to an embodiment of the disclosure.

FIG. 2 is a block diagram of a signal delay path 200 according to some embodiments of the disclosure. A memory device may include the signal delay path 200 in some embodiments. For example, the semiconductor device 100 may include the signal delay path 200 in some embodiments. The signal delay path 200 includes a bias generator 205, delay circuit 210, and pulse generator circuit 215. In some examples, the bias generator 205 may be included in the bias generator 150. In some examples, the delay circuit 210 may be included in the delay circuit 155. In some examples, the pulse generator 215 may be included in the sense amplifier control circuit 160. In some cases, the sense amplifier control circuit 160 may be an abstracted version of the pulse generator circuit 215. The signal delay path 200 provides a supply line control signal 245 to VTC sense amplifiers 170 to control a duration of a compensation phase of the VTC sense amplifiers 170.

The bias generator circuit 205 may generate bias signal 220 having a voltage that is based on combinations of temperature dependent and/or independent currents. For example, in some embodiments of the disclosure, the bias generator circuit 205 may generate bias signal 220 based on combinations of IPTAT and IZTAT currents generated within the bias generator circuit 205. The IPTAT current increases as temperature rises, and the IZTAT current is stable with changes in temperature. In some embodiments of the disclosure, the voltage of the bias signal 220 may be based on proportions of the IPTAT versus IZTAT currents generated. In some embodiments of the disclosure, the bias generator circuit 205 may generate bias signal 220 based on combinations of IPTAT and ICTAT currents generated within the bias generator circuit 205. The IPTAT current increases as temperature rises as previously described, and the ICTAT current decreases as temperature rises. In some embodiments of the disclosure, the voltage of the bias signal 220 may be based on proportions of the IPTAT versus ICTAT currents generated.

In some examples, the bias generator circuit 205 may generate the bias signal 220 based on a detector circuit configured to determine that a voltage threshold compensation operation duration is less than, or greater than, a threshold duration (e.g., during a test mode). In some examples, the bias generator circuit 205 may generate bias signal 220 to improve one or more sense margins of the semiconductor device (e.g., at sense amplifier) based on the temperature slope control signal 230. The detector circuit may be capable of or may be coupled to a circuit capable of identifying a temperature slope (e.g., and a corresponding trim code) for the bias generator circuit 205 (e.g., based on the determining from the detector circuit). The bias generator 205 may receive a temperature slope control signal 230 indicating which temperature slope is desired. The bias generator 205 may provide the bias signal having a voltage that is based on the desired temperature slope.

In some embodiments of the disclosure, bias generator circuit 205 may use thermometer decoding to adjust PTAT and ZTAT, or PTAT and CTAT currents. Thermometer decoding may be used to switch between PTAT and CTAT or ZTAT currents to reduce step size error.

Based on the temperature dependent currents, the bias generator circuit 205 (e.g., voltage generator circuit) may provide the bias signal 220 to the delay circuit 210. The delay circuit 210 may additionally receive a compensation control signal 235 (e.g., an activation signal). The compensation control signal 235 is activated to activate a sense amplifier VTC operation performed during a compensation phase. The delay circuit 210 may provide a delayed signal 240 (e.g., an activation signal with a delay) based on the bias signal 220, the compensation control signal 235, or both, to the pulse generator circuit 215. The pulse generator circuit 215 may further delay the delayed signal 240 using one or more circuit elements, which may be known to one skilled in the art. The pulse generator circuit 215 may provide a supply line control signal 245 (e.g., which may include a voltage threshold compensation pulse) to the VTC sense amplifiers 170 with a pulse width based on the compensation control signal 235, the delayed signal 240, or a combination thereof. The supply line control signal 245 may be delayed based on the bias signal 220 from the bias generator 205 (e.g., duration or pulse width), and thus the compensation phase of the VTC sense amplifiers 170 may be extended in duration (e.g., based on the pulse width). The compensation phase may be reduced in duration similarly based on the bias generator circuit 205. Specific descriptions and examples of the signal delay path 200 may be described further at least at FIGS. 3 and 4.

Figure 3:
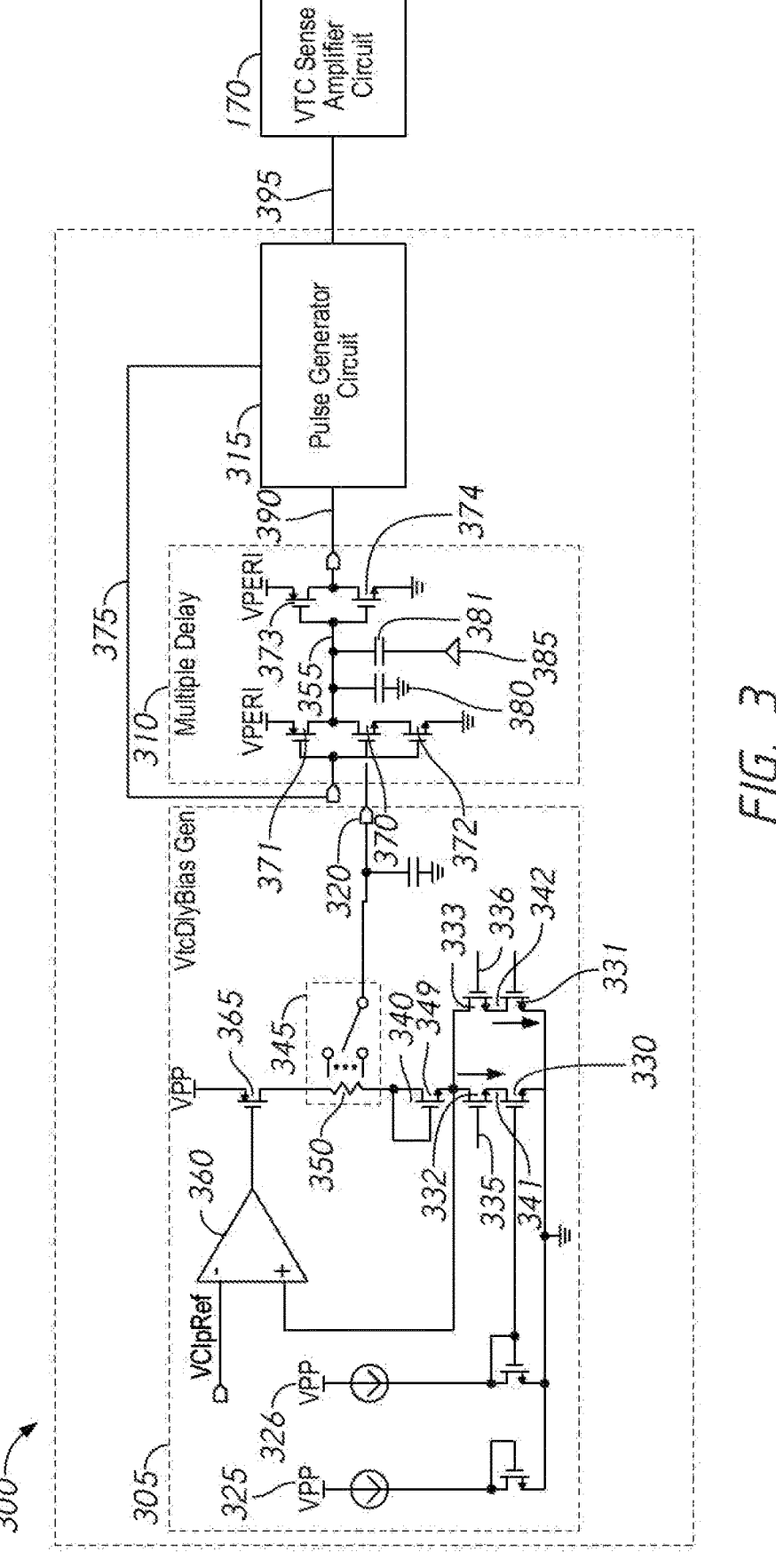
FIG. 3 is a schematic diagram of a signal delay path according to some embodiments of the disclosure.

FIG. 3 is a schematic diagram of signal delay path 300 according to an embodiment of the disclosure. In some examples, the voltage delay bias generator circuit 305 may be included in the bias generator circuit 150, the bias generator 205, or both. In some examples, the delay circuit 310 may be included in the delay circuit 155, the delay circuit 210, or both. In some examples, pulse generator circuit 315 may be included in the sense amplifier control circuit 160, the pulse generator circuit 215, or both. In some cases, the sense amplifier control circuit 160 may be an abstracted version of the pulse generator circuit 315 or pulse generator 215. In some examples, the VTC sense amplifier 170 may be included in the VTC sense amplifier 170, the VTC sense amplifier 170, or both. The signal delay path 300 may generally correspond to one or more embodiments that utilize combinations of a PTAT current and a ZTAT current to generate VTC delay bias 320 (e.g., VtcDlyBias).

The voltage delay bias generator circuit 305 includes current generator 325 and current generator 326. The generator 325 and generator 326 may be configured to receive voltages VPP. The generator 325 may be configured to generate a first current 342 (e.g., 2 micro amperes) of IZTAT current (e.g., from a bandgap reference circuit). The generator 326 may be configured to generate a second current 341 (e.g., 2 micro amperes) of IPTAT current (e.g., from a bandgap reference circuit). The generator 325 is coupled to transistor 331 in a current mirror configuration, with the first (IZTAT) current 342 provided through transistor 331. The generator 326 is coupled to transistor 330 in a current mirror configuration, with the second (IPTAT) current 341 provided through transistor 330. The first current may be combined (e.g., added) to the second current resulting in a current 340. The transistor 330 and transistor 332 may be coupled in series, and transistor 331 and transistor 333 may be coupled in series. One or more of the transistors 330, 332, 331, and 333 may be referred to as a current generator circuit. The transistor 330 may receive a voltage of second current (e.g., $V_{IPTAT}$). The transistor 331 may receive a voltage of the first current (e.g., $V_{IZTAT}$). The gate of transistor 332 may receive temp slope select signal 335 (e.g., TMPSLP), which may include three bits. The gate of transistor 333 may receive the complement of temp slope select signal 336 (e.g., TMPSLP_b), which may include three bits. The current through transistor 332 and transistor 330 may be based on the IPTAT current and the temp slope select signal 335, and the current through transistor 333 and transistor 331 may be based on the IZTAT current and the complement of the temp slope select signal 336. Adjusting these currents using the transistors 332 and 333 with the temp slope select signal TMPSLP may affect the VTC delay bias 320.

Temp slope select signal 335 (and the complement temp slope select signal 336, or a different temp slope select signal, provided to the gate of transistor 333) may include three bits in some embodiments, and may thus be capable of storing or representing up to 8 states or "code increments" or "trim codes" (e.g., 000, 001, 010, 011, 100, 101, 110, or 111). Each state may correspond to a temperature slope. Each state may thus represent a combination of IPTAT and IZTAT current, or IPTAT and ICTAT current as described in FIG. 4. The current 340 may be a sum of the IPTAT current 341 and IZTAT current 342. Some code increments may correspond to current 340 being more PTAT or more ZTAT as a proportion of the total current 340. For some temperatures (e.g., temperatures except for 10 degrees Celsius, where VTC delay bias 320, and thus delay, may be constant or relatively constant for some or all code increments), as a total current (e.g., current 340) becomes more ZTAT in nature (e.g., a greater proportion of current 340 is ZTAT than PTAT), the voltage of VTC delay bias 320 may decrease. As VTC delay bias 320 decreases, a delay of the delay circuit 310 increases and the duration of the compensation phase (e.g., extending the duration of the compensation phase by the delay amount) may increase. Current 340 being more ZTAT in nature for some code increments may result in current 340 correspondingly becoming less PTAT in nature for such code increments, and vice versa. In contrast, as a total current (e.g., current 340) becomes less ZTAT in nature (e.g., a lower proportion of current 340 is ZTAT than PTAT), the voltage of VTC delay bias 320 may increase. As VTC delay bias 320 increases, a delay of the delay circuit 310 decreases and the duration of the compensation phase (e.g., extending the duration of the compensation phase by the delay amount) may decrease. Current 340 being less ZTAT in nature for some code increments may result in current 340 correspondingly becoming more PTAT in nature for such code increments, and vice versa.

Thermometer decoding may be used to adjust PTAT and ZTAT currents (e.g., current 341, current 342, or both) in some embodiments of the disclosure. For example, the transistor 332 may include multiple transistors coupled in parallel between transistors 349 and 330, with each parallel-coupled transistor having a gate that is controlled by a respective bit of the temp slope select signal 335. Similarly, the transistor 333 may include multiple transistors coupled in parallel between transistors 349 and 331, with each parallel-coupled transistor having a gate that is controlled by a respective bit of the complement of temp slope select signal 336.

For a temperature in which one or more temperature slopes intersect (e.g., 10 degrees Celsius), different code increments (e.g., temperature slopes) may still correspond to different proportions of ZTAT and PTAT currents (e.g., currents 341 and 342), but such currents may be adjusted such that the VTC delay bias 320 is the same for each code increment (e.g., temperature slope). Different code increments may correspond to current 340 (e.g., the sum of IPTAT current 341 and IZTAT current 342) being greater, equal to, approximately equal to, or less in overall current magnitude than other code increments. The combined IPTAT and IZTAT current sum may be the same for some or all code increments for some temperatures (e.g., at 10 degrees Celsius), and the combined IPTAT and IZTAT current sum may be different for some or all code increments for other temperatures (e.g., at 110 degrees Celsius). In some cases, the current sum at one or more code increments at a given temperature may be the same as the current sum at the same one or more code increments at a different temperature, but may be different for other code increments (e.g., IPTAT and IZTAT currents may sum to a similar or same value at 10 degrees Celsius and 110 degrees Celsius, but not at other code increments). Generally, the temp slope select signals may modulate how much IPTAT and IZTAT make up current 340.

In some cases, IPTAT and IZTAT currents may be capable of delaying the compensation phase by up to a certain delay temp slope (e.g., 26%). Combinations of IPTAT and ICTAT may be capable of further increasing delay temp slopes to greater values (e.g., greater than 30%). IPTAT and ICTAT embodiments may be discussed further in at least FIG. 4 of the disclosure.

Current 340 may be provided to trim circuit 345 (e.g., resistor trim circuit). Trim circuit 345 may include a variable resistor modulated by a trim signal 350 (e.g., Trim [3:0]). The VTC delay bias 320 may be based in part on the current 340 and the resistance of the variable resistor of the trim circuit 345. Trim signal 350 may include 4 bits. In some cases, for code "0000" to "0111," capacitor C1 380 may be loaded to node K 355. In some cases, for code "1000" to "1111," capacitor C1 380 and capacitor C2 381 may be loaded to node K 355. The variable resistor may generally function to set up a relationship between current 340 and the current through the transistor 370. For example, if the variable resistor has no resistance, the current 340 may be the same as the current through the transistor 370. However, if the variable resistor has some resistance, then the voltage across transistor 370 may be higher than the voltage across transistor 349 (e.g., VGS), and the current through the transistor 370 may be greater than the current 340 (such that the current may not be mirrored one-to-one, but be based on the variable resistor).

Amplifier 360 may receive a voltage (e.g., 0.2 V) from a reference signal (e.g., VClpRef) at the negative terminal, and the voltage of the node corresponding to the source of transistor 349 is provided to the positive terminal. The amplifier 360 may output a signal to a gate of transistor 365. Transistor 365 may be coupled to a signal with a voltage (e.g., VPP) at the source of transistor 365, and may be coupled to the trim circuit 345 at the drain of transistor 365. The amplifier 360 controls the transistor 365 to result in a voltage at the source of the transistor 349 that is equal to the voltage of the reference signal. Based on the trim signal 350 and the trim circuit 345, VTC delay bias 320 may be developed and provided to delay circuit 310.

VTC delay bias 320 may be provided to the gate of transistor 370. If VTC delay bias 320 is of a lower magnitude, the delay of the delay circuit 310 increases and the duration for the compensation phase may be increased. Lower magnitudes of VTC delay bias 320 may cause the node K 355 to take longer to discharge, resulting in a longer delay. Similarly, higher magnitudes of VTC delay bias 320 may cause the node K 355 to take a shorter amount of time to discharge, resulting in a shorter delay of the delay circuit 310 and the duration for the compensation phase may be decreased. The voltage at the drain of transistor 349 may be mirrored to the voltage at the gate of transistor 370. In this way, the current 340 may be mirrored to the current through transistor 370, as discussed previously.

Delay circuit 310 may additionally receive compensation control signal 375, which may be provided to the gates of transistors 371 and 372. The delay circuit 310 delays the compensation control signal 375 to provide a delayed signal 390. As previously described, the delay of the delay circuit 310 increases as the VTC delay bias 320 decreases, and the delay of the delay circuit 310 decreases as the VTC delay bias 320 increases. Transistors 370, 371, and 372 may be coupled in series. A voltage (VPERI) may be provided to the source of transistor 371. The source of transistor 372 may be coupled to a ground voltage. The drains of transistors 370 and 371 may be coupled to node K 355. Node K 355 may be coupled to capacitor C1 380 and capacitor C2 381. Capacitor C2 381 may be coupled to the output of inverter 385. The input of inverter 385 may receive trim signal 350 (e.g., one bit of the Trim signal, for example, Trim [3]). If trim signal 350 is high, more delay may be achieved by the delay circuit 310. If trim signal 350 is low, less delay may be achieved by the delay circuit 310. Node K may be coupled to the gates of transistors 373 and 374. Transistor 373 and transistor 374 may be coupled in series as an inverter. The source of transistor 373 may receive a voltage (e.g., VPERI), and the source of transistor 374 may be coupled to a ground voltage. The drains of transistors 373 and 374 may be coupled to pulse generator circuit 315 and may provide the delayed signal 390 to the pulse generator circuit 315. In some examples, a plurality of delay circuits 310 may be coupled in series or in a cascade connection to provide further delay.

Pulse generator 315 provides a pulse signal as a supply line control signal 395. The pulse width of the pulse signal is based at least in part on the delay of the delay circuit 310. For example, as the delay of the delay circuit 310 increases the pulse width of the pulse signal provided by the pulse generator 315 increases, and conversely, as the delay of the delay circuit 310 decreases the pulse width of the pulse signal provided by the pulse generator 315 decreases. In some embodiments, the pulse generator 315 may include one or more circuits or circuit elements, at least a portion of which may be configured to provide a pulse signal as the supply line control signal 395 having a pulse width based on the delay of the delayed signal 390 provided from the delay circuit 310. Pulse generator 315 may receive the compensation control signal 375. Based on the delayed signal 390, the compensation control signal 375, and the one or more circuits or circuit elements of pulse generator 315, pulse generator 315 may provide a pulse signal as the supply line control signal 395 to the VTC sense amplifier 170. For example, the pulse generator 315 may provide supply line control signal 395 to a sense amplifier activation circuit of the VTC sense amplifier 170 to activate the VTC compensation phase. The sense amplifier activation circuit may include a transistor. The supply line control signal 395 may be provide to the gate of the transistor of the sense amplifier activation circuit. The duration of the compensation phase of the VTC sense amplifier 170 may be based on the supply line control signal 395. For example, the compensation phase may be based on a pulse width of the pulse signal provided by the pulse generator 315 as the supply line control signal 395. As previously described, the pulse width of the pulse signal may be based in part on the delay of the delay circuit 310. The sense amplifier activation circuit may be utilized during one or more operations of the VTC sense amplifier 170 in addition or alternatively to the compensation phase of the VTC sense amplifier 170 to, for example, activate the VTC sense amplifier 170. For example, the sense amplifier activation circuit may be activated during a sense amplifier activation phase.

Figure 4:
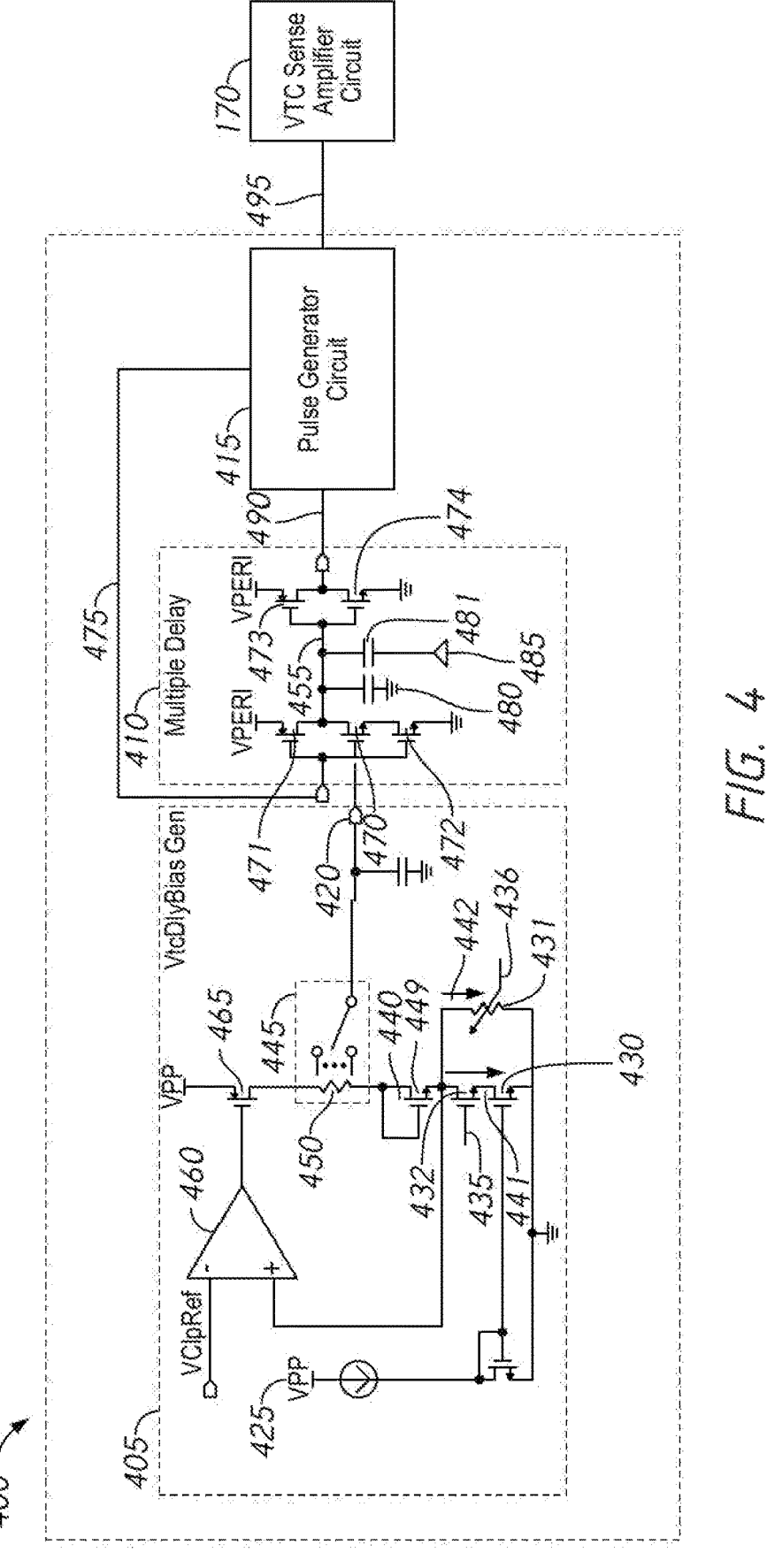
FIG. 4 is a schematic diagram of a signal delay path according to an embodiment of the disclosure.

FIG. 4 is a schematic diagram of signal delay path 400 according to an embodiment of the disclosure. In some examples, the voltage delay bias generator circuit 405 may be included in the bias generator circuit 150, the bias generator 205, the voltage delay bias generator circuit 305, or a combination thereof. In some examples, the delay circuit 410 may be included in the delay circuit 155, the delay circuit 210, the delay circuit 310, or a combination thereof. In some examples, pulse generator circuit 415 may be included in the sense amplifier control circuit 160, the pulse generator circuit 215, the pulse generator circuit 315, or a combination thereof. In some cases, the sense amplifier control circuit 160 may be an abstracted version of the pulse generator circuit 415, pulse generator circuit 315, or pulse generator circuit 215. The signal delay path 400 may generally correspond to one or more embodiments that utilize combinations of a PTAT current and a CTAT current to generate VTC delay bias 420 (e.g., VtcDlyBias).

The voltage delay bias generator circuit 405 includes current generator 425. The generator 425 may be configured to generate a voltage VPP. The generator 425 is configured to generate a first current 441 (e.g., 2 micro amperes) of IPTAT current (e.g., from a bandgap reference circuit). The generator 425 is coupled to transistor 430 in a current mirror configuration, with the first (IPTAT) current 441 provided through transistor 430. The first current may be provided to the source of transistor 430 and provided to a variable resistor 431, which may be modulated by the complement of the temp slope select signal 436, or a different temp slope select signal (e.g., TMPSLP_b), which may include three bits. The current through the variable resistor 431 (e.g., CTAT current) may be equal to VClpRef (e.g., Vstable, or 0.2 V) divided by the resistance of the variable resistor (Rptat). The transistor 430 and transistor 432 may be coupled in series. One or more of the transistors 430, 43, and the variable resistor 431 may be referred to as a current generator circuit. The gate of transistor 432 may receive temp slope select signal 435 (e.g., TMPSLP), which may include three bits. The current through the line from transistor 432 and transistor 430 may be based on the IPTAT current and the temp slope select signal 435, and the current through the line including the variable resistor 431 may be based on the ICTAT current and the complement of the temp slope select signal 436. Adjusting these currents using the transistor 432 and variable resistor 431 with the temp slope select signal TMPSLP may affect the VTC delay bias 420.

Temp slope select signal 435 (and the complement temp slope select signal 436, or a different temp slope select signal, provided to the variable resistor 431) may include three bits in some embodiments, and may thus be capable of storing or representing up to 8 states or "code increments" or "trim codes" (e.g., 000, 001, 010, 011, 100, 101, 110, or 111). Each state may correspond to a temperature slope. Each state may thus represent a combination of IPTAT and ICTAT current. The current 440 may be a sum of the IPTAT current 441 and the ICTAT current 442. Some code increments may correspond to current 440 being more PTAT or more CTAT as a proportion of the total current. For some temperatures (e.g., temperatures except for 10 degrees Celsius, where VTC delay bias 420, and thus delay, may be constant or relatively constant for some or all code increments), as a total current (e.g., current 440) becomes more CTAT in nature (e.g., a greater proportion of current 440 is CTAT than PTAT), the voltage of VTC delay bias 420 may decrease. As VTC delay bias 420 decreases, the delay of the delay circuit 410 increases and the duration of the compensation phase (e.g., extending the duration of the compensation phase by the delay amount) may increase. Current 440 being more CTAT in nature for some code increments may result in current 440 correspondingly becoming less PTAT in nature for the code increments, and vice versa. In contrast, as a total current (e.g., current 440) becomes less CTAT in nature (e.g., a lower proportion of current 440 is CTAT than PTAT), the voltage of VTC delay bias 420 may increase. As VTC delay bias 420 increases, a delay of the delay circuit 410 decreases and the duration of the compensation phase (e.g., extending the duration of the compensation phase by the delay amount) may decrease. Current 440 being less CTAT in nature for some code increments may result in current 440 correspondingly becoming more PTAT in nature for such code increments, and vice versa.

Thermometer decoding may be used to adjust PTAT and CTAT currents (e.g., current 441, current 442, or both) in some embodiments of the disclosure. For example, the transistor 432 may include multiple transistors coupled in parallel to transistors 449 and 430, with each parallel-coupled transistor having a gate that is controlled by a respective bit of the temp slope select signal 435.

For a temperature in which one or more temperature slopes intersect (e.g., 10 degrees Celsius), different code increments may still correspond to different proportions of CTAT and PTAT currents (e.g., currents 441 and 442), but such currents may be adjusted such that the VTC delay bias 420 is the same for each code increment (e.g., temperature slope). Different code increments may correspond to current 440 (e.g., the sum of IPTAT current 441 and ICTAT current 442) being greater, equal to, approximately equal to, or less in overall current magnitude than other code increments. In some examples, the combined IPTAT and ICTAT current sum may be the same for some or all code increments for some temperatures (e.g., at 10 degrees Celsius), and the combined IPTAT and ICTAT current sum may be different for some or all code increments for other temperatures (e.g., at 110 degrees Celsius). In some cases, the current sum at one or more code increments at a given temperature may be the same as the current sum at the same one or more code increments at a different temperature, but may be different for other code increments (e.g., IPTAT and ICTAT currents may sum to a similar or same value at 10 degrees Celsius and 110 degrees Celsius, but not at other code increments). Generally, the temp slope select signals may modulate how much IPTAT and ICTAT currents make up current 440.

In some cases, IPTAT and ICTAT currents may be capable of delaying the compensation phase greater amounts at some temperatures than that achievable by IPTAT and IZTAT currents, corresponding to steeper temperature slopes (e.g., up to 41% delay temp slopes for IPTAT and ICTAT currents, rather than 26% for IPTAT and IZTAT currents).

Current 440 may be provided to trim circuit 445 (e.g., resistor trim circuit). Trim circuit 445 may include a variable resistor modulated by a trim signal 450 (e.g., Trim [3:0]). The VTC delay bias 420 may be based in part on the current 440 and the resistance of the variable resistor of the trim circuit 445. Trim signal 450 may include 4 bits. In some cases, for code "0000" to "0111," capacitor C1 480 may be loaded to node K 455. In some cases, for code "1000" to "1111," capacitor C1 480 and capacitor C2 481 may be loaded to node K 455. The variable resistor may generally function to set up a relationship between current 440 and the current through the transistor 470. For example, if the variable resistor has no resistance, the current 440 may be the same as the current through the transistor 470. However, if the variable resistor has some resistance, then the voltage across transistor 470 may be higher than the voltage across transistor 449 (e.g., VGS), and the current through the transistor 470 may be greater than the current 440 (such that the current may not be mirrored one-to-one, but be based on the variable resistor).

Amplifier 460 may receive a voltage (e.g., 0.2 V) from a reference signal (e.g., VClpRef) at the negative terminal, and the voltage of the node corresponding to the source of transistor 449 is provided to the positive terminal. The amplifier 460 may output a signal to a gate of transistor 465. Transistor 465 may be coupled to a signal with a voltage (e.g., VPP) at the source of transistor 465, and may be coupled to the trim circuit 445 at the drain of transistor 465. The amplifier 460 controls the transistor 465 to result in a voltage at the source of the transistor 449 that is equal to the voltage of the reference signal. Based on the trim signal 450 and the trim circuit 445, VTC delay bias 420 may be developed and provided to delay circuit 410.

VTC delay bias 420 may be provided to the gate of transistor 470. If VTC delay bias 420 is of a lower magnitude, the delay of the delay circuit 410 increases and the duration for the compensation phase may be increased. Lower magnitudes of VTC delay bias 420 may cause the node K 455 to take longer to discharge, resulting in a longer delay. Similarly, higher magnitudes of VTC delay bias 420 may cause the node K 455 to take a shorter amount of time to discharge, resulting in a shorter delay of the delay circuit 410 and the duration for the compensation phase may be decreased. The voltage at the drain of transistor 449 may be mirrored to the voltage at the gate of transistor 470. In this way, the current 440 may be mirrored to the current through transistor 470, as discussed previously.

Delay circuit 410 may additionally receive compensation control signal 475, which is provided to the gates of transistors 471 and 472. The delay circuit 410 delays the compensation control signal 475 to provide a delayed signal 490. As previously described, the delay of the delay circuit 410 increases as the VTC delay bias 420 decreases, and the delay of the delay circuit 410 decreases as the VTC delay bias 420 increases. Transistors 470, 471, and 472 may be coupled in series. A voltage (VPERI) may be provided to the source of transistor 471. The source of transistor 472 may be coupled to a ground voltage. The drains of transistors 470 and 471 may be coupled to node K 455. Node K 455 may be coupled to capacitor C1 480 and capacitor C2 481. Capacitor C2 481 may be coupled to the output of inverter 485. The input of inverter 485 may receive the trim signal 450 (e.g., one bit of the Trim signal, for example, Trim [3]). If trim signal 450 is high, more delay may be achieved by the delay circuit 410. If trim signal 450 is low, less delay may be achieved by the delay circuit 410. Node K may be coupled to the gates of transistors 473 and 474. Transistor 473 and transistor 474 may be coupled in series as an inverter. The source of transistor 473 may receive a voltage (e.g., VPERI), and the source of transistor 474 may be coupled to a ground voltage. The drains of transistors 473 and 474 may be coupled to pulse generator circuit 415 and may provide the delayed signal 490 to the pulse generator circuit 415. In some examples, a plurality of delay circuits 410 may be coupled in series or in a cascade connection to provide further delay.

Pulse generator 415 provides a pulse signal as a supply line control signal 495. The pulse width of the pulse signal is based at least in part on the delay of the delay circuit 410. For example, as the delay of the delay circuit 410 increases the pulse width of the pulse signal provided by the pulse generator 415 increases, and conversely, as the delay of the delay circuit 410 decreases the pulse width of the pulse signal provided by the pulse generator 415 decreases. In some embodiments, pulse generator 415 may include one or more circuits or circuit elements, at least a portion of which may be configured to provide a pulse signal as the supply line control signal 495 having a pulse width based on the delay of the delayed signal 490 provided from the delay circuit 410. Pulse generator 415 may receive the compensation control signal 475. Based on the delayed signal 490, the compensation control signal 475, and the one or more circuits or circuit elements of pulse generator 415, pulse generator 415 may provide a pulse signal as the supply line control signal 495 to the VTC sense amplifier 170. For example, the pulse generator 415 may provide supply line control signal 495 to a sense amplifier activation circuit of the VTC sense amplifier 170 to activate the VTC compensation phase. The sense amplifier activation circuit may include a transistor. The supply line control signal 495 may be provide to the gate of the transistor of the sense amplifier activation circuit. The duration of the compensation phase of the VTC sense amplifier 170 may be based on the supply line control signal 495. As previously described, the pulse width of the pulse signal may be based on part on the delay of the delay circuit 410. For example, the compensation phase may be based on a pulse width of the pulse signal provided by the pulse generator 415 as the supply line control signal 495. The sense amplifier activation circuit may be utilized during one or more operations of the VTC sense amplifier 170 in addition or alternatively to the compensation phase of the VTC sense amplifier 170 to, for example, activate the VTC sense amplifier 170. For example, the sense amplifier activation circuit may be activated during a sense amplifier activation phase.

Figure 5:
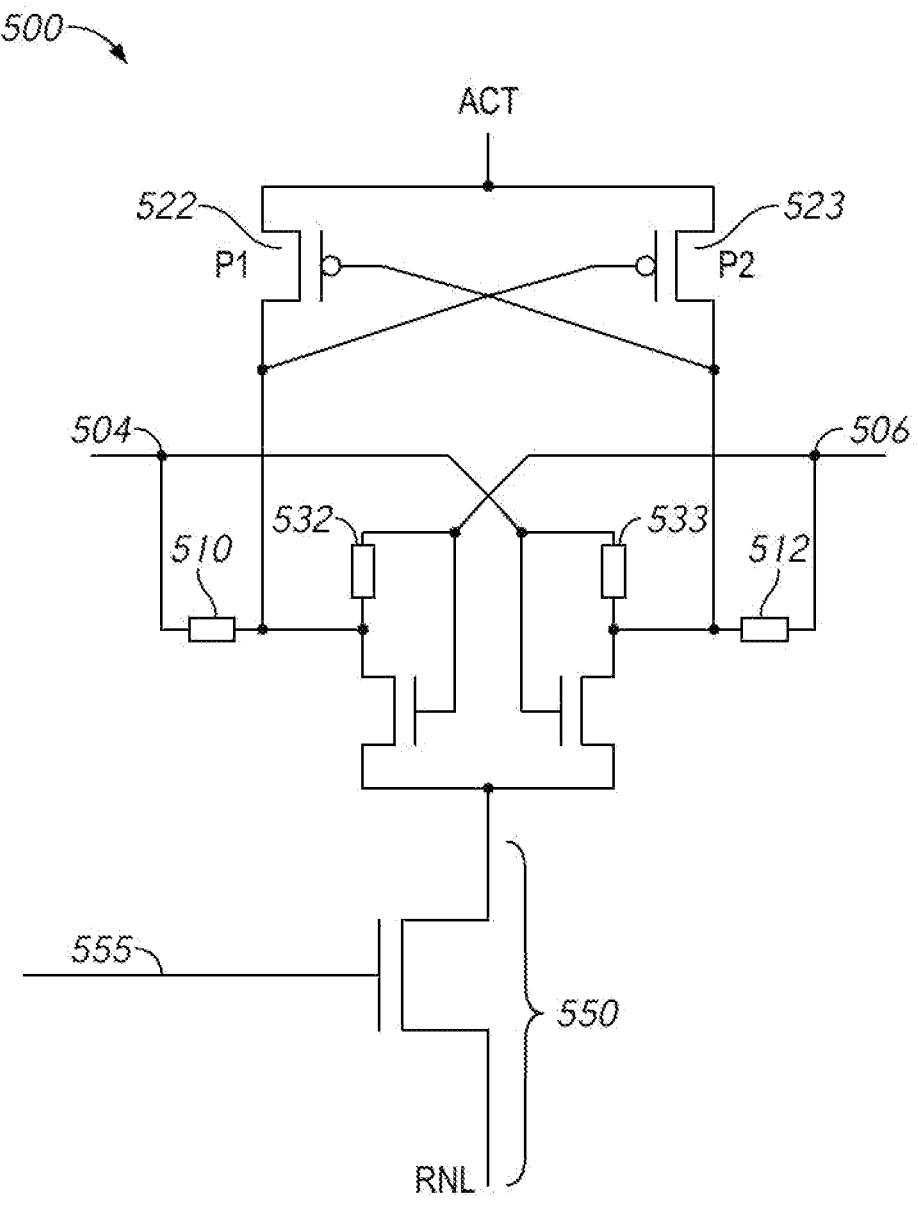
FIG. 5 is a schematic diagram of a sense amplifier according to an embodiment of the disclosure.

FIG. 5 is a schematic diagram of a sense amplifier 500 according to an embodiment of the disclosure. The sense amplifier 500 may, in some embodiments, be included in the sense amplifier 170 of FIGS. 1, 250 and/or 251 of FIG. 2, 170 of FIG. 3, 170 of FIG. 4, or a combination thereof.

The sense amplifier 500 selectively amplifies a signal on the digit lines BLB and BLT. The sense amplifier 500 includes a pair of ISO switches 510 and 512 (e.g., NMOS switches or isolation transistors). These ISO switches 510 and 512 may be coupled to respective isolation signals ISOB and ISOT (not pictured) respectively. The sense amplifier 500 includes p-type transistors P1 522 and P2 523 and n-type transistors M1 524 and M2 526. The transistor P1 522 has a node that is provided an activation voltage ACT, a node coupled to a node GutB, and a gate coupled to a node GutT. The node GutB may be coupled through a transistor 532 to the bit line BLT, and the node GutT may be coupled through a transistor 533 to the bit line BLB. The transistor P2 523 has a node that is provided the activation voltage ACT, a node coupled to node GutT, and a gate coupled to node GutB. The transistor M1 has a node coupled to the node GutB, a node that is provided an activation voltage RNL, and a gate coupled to the bit line BLT. The transistor M2 has a node coupled to the node GutT, a node that is provided the activation voltage RNL, and a gate coupled to the bit line BLB. During access operations, the activation voltages ACT and RNL may be provided to activate the sense amplifier 500.

The first ISO switch 510 is coupled between the bit line BLB and the node GutB. The first ISO switch 510 has a gate coupled to a signal ISOB. The first ISO switch 510 may act as a switch and may couple the bit line BLB to the node GutB when the signal ISOB is active. The first ISO switch 510 may be an n-type transistor which is active when the signal ISOB is at a logical high. The second ISO switch 512 is coupled between the bit line BLT and the node GutT, with a gate coupled to a signal ISOT. When the signal ISOT is active, the second ISO switch 512 couples the bit line BLB 506 to the gut node GutT.

In operation, a charge state of an activated memory cell is provided to the sense amplifier 500, and when the sense amplifier 500 is activated by providing the activation voltages ACT and RNL, the charge state is amplified, resulting in one of the digit lines BLB or BLT being driven to the activation voltage ACT and the other digit line being driven to the activation voltage RNL.

In some cases, the RNL line may be coupled to a sense amplifier activation circuit 550, which may include a transistor. The transistor may receive a voltage (e.g., a SAN voltage, or a SANVtc voltage) configured to activate the sense amplifier during one or more phases of sense amplification (e.g., compensation phase, sense amplifier activation phase). The duration of the voltage applied to the gate of the transistor of the sense amplifier activation circuit 550 may indicate or include the duration of the corresponding phase (e.g., compensation phase, sense amplifier amplification phase). Accordingly, the delay applied to the signal 395 from the pulse generator 315 or 415 in FIG. 3 or 4 may extend the duration the voltage is applied to the gate of the transistor to activate the sense amplifier activation circuit 550.

Figure 6:
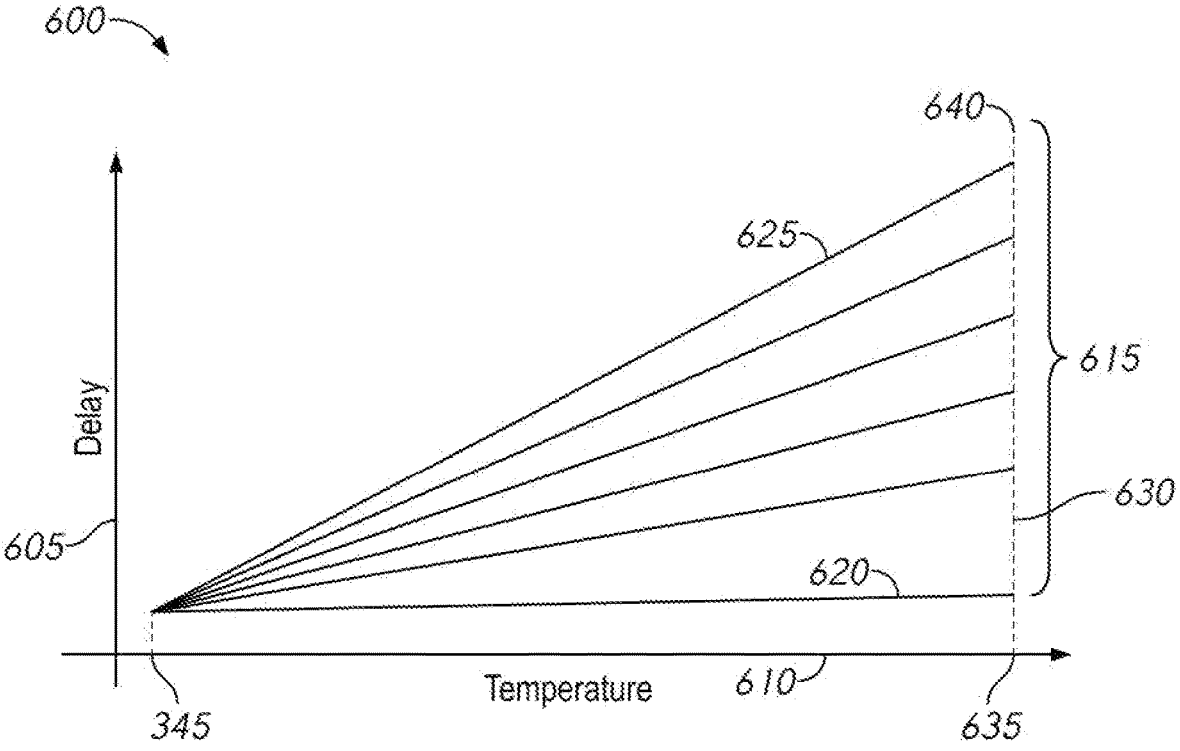
FIG. 6 is a diagram of temperature slopes according to an embodiment of the disclosure.

FIG. 6 is a plot 600 of delay versus temperature according to some embodiments of the disclosure. Duration of a compensation phase for a VTC sense amplifier may be based on delay 605, for example, the total duration of the compensation phase, including the extension of duration. Temperature 610 may refer to a temperature of a memory device. In some cases, lines 615 may be referred to as "temperature slopes." One skilled in the art may understand that the temperature slopes described in plot 600 are merely exemplary, and do not limit the scope of potential temperature slopes capable of being supported by the circuitry described herein. Different temperature slopes may be selected based on a temp slope select signal, as previously described.

By utilizing examples described herein, a compensation phase of a VTC sense amplifier may be able to be delayed by different amounts (e.g., the compensation phase is extended in duration by the delay amount) for a given temperature. For example, when configured for temperature slope 620, a memory device may be capable of extending the compensation phase by a first delay 630 (e.g., 1.68 nanoseconds (ns)) at a temperature 635 (e.g., 110 degrees Celsius). When configured for temperature slope 625, the memory device may be capable of extending the compensation phase by a second delay 640 (e.g., 2.03 ns) at the temperature 635, where the second delay may be greater than the first delay. Both temperature slope 620 and temperature slope 625 may intersect (e.g., have a same delay) at temperature 645 (e.g., 10 degrees Celsius).

One skilled in the art may appreciate that other temperature slopes are possible. For example, temperature slopes that have a negative slope are possible. In some other examples, temperature slopes that do not all intersect at a given temperature (e.g., temperature 645) may be possible. Some temperature slopes may intersect at a given temperature, while other temperature slopes intersect at other temperatures. One skilled in the art may appreciate that the memory device may be capable of adjusting PTAT currents, ZTAT currents, CTAT currents, or a combination thereof, within the bounds possible by the described circuitry herein, to produce such temperature slopes.

Although various embodiments of the disclosure have been disclosed, it will be understood by those skilled in the art that the embodiments extend beyond the specifically disclosed embodiments to other alternative embodiments and/or uses and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying mode of the disclosed embodiments. Thus, it is intended that the scope of at least some of the present disclosure should not be limited by the particular disclosed embodiments described above.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus, comprising:
a sense amplifier circuit configured to perform a voltage threshold compensation operation having a duration based on a supply line control signal; and
a signal delay path configured to receive a temperature slope control signal and a compensation control signal and provide the supply line control signal based at least in part on delaying the compensation control signal based at least in part on the temperature slope control signal, the temperature slope control signal corresponding to a temperature slope selected from a plurality of temperature slopes,
wherein the sense amplifier circuit is configured to perform for a temperature the voltage threshold compensation operation with a first duration according to a first delay based at least in part on a first selected temperature slope, and further configured to perform for the temperature the voltage threshold compensation operation with a second duration according to a second delay based at least in part on a second selected temperature slope.

2. The apparatus of claim 1, further comprising:
a bias generator circuit configured to receive the first selected temperature slope control signal and a second selected temperature slope control signal,
wherein the sense amplifier circuit is configured to perform the voltage threshold compensation operation based at least in part on the first selected temperature slope control signal selecting the first selected temperature slope, and wherein the sense amplifier circuit is configured to perform the second voltage threshold compensation operation based at least in part on the second temperature slope control signal selecting the second temperature slope, wherein the first and second temperature slopes are associated with a ratio of a change of delay to a change of temperature.

3. The apparatus of claim 2, wherein the sense amplifier circuit is configured to perform a third voltage threshold compensation operation with a third delay, the third delay based at least in part on a second temperature of the at least part of the apparatus, and wherein the third delay is the same for the first selected temperature slope and for the second temperature slope.

4. The apparatus of claim 1, wherein the first delay is associated with a first current combination of a first current and a second current, wherein the second delay is associated with a second current combination of a third current and a fourth current.

5. The apparatus of claim 4, wherein the first current and the third current are proportional to absolute temperature (PTAT), and the second current and the fourth current are complementary to absolute temperature (CTAT) or zero to absolute temperature (ZTAT).

6. The apparatus of claim 4, wherein a sum of the first current and the second current is greater than a sum of the third current and the fourth current.

7. The apparatus of claim 4, wherein the first current is greater than the third current, and wherein the fourth current is greater than the second current.

8. The apparatus of claim 4, wherein the third current is a smaller proportion of the second current combination than the first current is of the first current combination, and wherein the fourth current is a greater proportion of the second current combination than the second current is of the first current combination.

9. An apparatus, comprising:
a bias generator circuit configured to provide a delay bias based at least in part on a first current, the first current having a first relationship with temperature, and having a second relationship with temperature;
a delay circuit configured to receive the delay bias and a first activation signal, and provide a second activation signal with a delay relative to the first activation signal, the delay based at least in part on the delay bias;
a pulse generator circuit configured to receive the second activation signal and provide a voltage threshold compensation pulse having a pulse width that is based at least in part on the second activation signal; and
a sense amplifier circuit configured to receive the voltage threshold compensation pulse and perform a voltage threshold compensation operation having a duration that is based at least in part on the pulse width of the voltage threshold compensation pulse.

10. The apparatus of claim 9, wherein the bias generator circuit comprises:
a current generator circuit configured to generate the first current based at least in part on one or more voltage sources and a temperature slope control signal, wherein the first current is the sum of a second current having the first relationship with temperature and a third current having the second relationship with temperature, and wherein the proportion of the second current and the third current is based at least in part on the temperature slope control signal.

11. The apparatus of claim 10, wherein the current generator circuit comprises one voltage source when the second current is complementary to absolute temperature (CTAT), and wherein the current generator circuit comprises two voltage sources when the second current is zero to absolute temperature (ZTAT).

12. The apparatus of claim 9, wherein the delay circuit is configured to mirror the first current from the bias generator circuit to a mirrored current at the delay circuit.

13. The apparatus of claim 12, wherein the bias generator circuit comprises:
a resistor trim circuit configured to adjust a resistance of the resistor trim circuit, wherein zero resistance of the resistor trim circuit corresponds to the mirrored current being equal to the first current, and wherein greater than zero resistance of the resistor trim circuit corresponds to the mirrored current being greater than the first current.

14. The apparatus of claim 9, further comprising:
a detector circuit configured to determine that a voltage threshold compensation operation duration is less than a threshold duration, or that one or more sense margins of the apparatus are insufficient, or a combination thereof, wherein the voltage threshold compensation operation duration is based at least in part on a temperature of at least part of the apparatus, and wherein the bias generator circuit is configured to provide the delay bias based at least in part on the determination.

15. The apparatus of claim 9, wherein the current having the first relationship with temperature is associated with a proportional to absolute temperature (PTAT) relationship, and wherein the current having the second relationship with temperature is associated with a complementary to absolute temperature (CTAT) relationship or a zero to absolute temperature (ZTAT) relationship.

16. A method, comprising:

providing a delay bias based at least in part on a first current, the first current having a first relationship with temperature, and having a second relationship with temperature;

receiving an activation signal;

providing a delayed activation signal with a delay relative to the activation signal that is based at least in part on the delay bias;

providing a voltage threshold compensation pulse having a pulse width that is based at least in part on the delayed activation signal; and performing a voltage threshold compensation operation having a duration that is based at least in part on the pulse width of the voltage threshold compensation pulse.

17. The method of claim 16, further comprising:

generating the first current based at least in part on one or more voltage sources and a temperature slope control signal, wherein the first current is the sum of a second current having the first relationship with temperature and a third current having the second relationship with temperature, and wherein the proportion of the second current and the third current is based at least in part on the temperature slope control signal.

18. The method of claim 16, further comprising:

determining that a voltage threshold compensation operation duration is less than a threshold duration, wherein the voltage threshold compensation operation duration is based at least in part on a temperature; and providing the delay bias based at least in part on the determination.

19. The method of claim 16, further comprising:

receiving a temperature slope control signal to select a temperature slope of a plurality of temperature slopes, each temperature slope of the plurality of temperature slopes associated with a different voltage threshold compensation operation duration for a given temperature.

20. The method of claim 19, wherein the first current is a sum of a second current and a third current, wherein receiving the temperature slope control signal for a higher temperature slope corresponds to decreasing a proportion of the second current and increasing a proportion of the third current.

* * * * *